US005365408A

United States Patent [19]

Apitz

[11] Patent Number: 5,365,408

[45] Date of Patent: Nov. 15, 1994

[54] CHASSIS WITH IMMOVABLE ATTACHMENT ELEMENTS AFFIXED THERETO

[75] Inventor: Siegfried Apitz, Schömberg, Germany

[73] Assignee: Nokia Technology GmbH, Pforzheim, Germany

[21] Appl. No.: 102,626

[22] Filed: Aug. 5, 1993

[30] Foreign Application Priority Data

Aug. 6, 1992 [DE] Germany ............................ 4226016

[51] Int. Cl.$^5$ ............................................... H05K 7/02

[52] U.S. Cl. .................................... 361/807; 248/544; 174/61

[58] Field of Search ............... 248/544, 545, 546, 547, 248/27.1, 27.2, 27.3, 65, 70, 71, 73; 361/807, 808, 752, 760, 761, 767; 174/61, 62–64

[56] References Cited

U.S. PATENT DOCUMENTS 3,358,550 12/1967 Crowther et al. .
4,202,091 5/1980 Ohnishi .
4,751,612 6/1988 Smith .
5,117,330 5/1992 Miazga ................................ 361/807
5,170,323 12/1992 Perretta et al. ....................... 361/807
5,191,515 3/1993 Hayamatsu ............................ 361/807

FOREIGN PATENT DOCUMENTS 0019667 12/1980 European Pat. Off. .
0033472 8/1981 European Pat. Off. .
2554306 5/1985 France .

*Primary Examiner*—Leo P. Picard
*Assistant Examiner*—Bot Ledynh
*Attorney, Agent, or Firm*—Ware, Fressola, Van Der Sluys & Adolphson

[57] ABSTRACT

An appliance chassis (1) contains attachment elements (52) for supporting, holding and affixing electrical and/or mechanical components (55), and, in the vicinity of certain attachment elements, has one attaching device (57) for inserting and affixing repair elements (56) assigned to the attachment elements, in the event of damage to the attachment elements. When inserted into the attaching device, the repair elements replace parts (14.1) of the holding device (14), which were lost because of damage to the attachment element.

5 Claims, 5 Drawing Sheets

CHASSIS WITH IMMOVABLE ATTACHMENT ELEMENTS AFFIXED THERETO

TECHNICAL FIELD

The invention concerns a chassis with attachment elements that cannot be separated from the chassis, with an attaching device for carrying and attaching components or chassis elements.

BACKGROUND OF THE INVENTION

Such chassis are located in many appliances, particularly in entertainment electronics or in measuring technology. A number of electrical and/or mechanical components are affixed to such chassis, such as motors, gears, partial chassis, switches and others, which are either plate- or tub-shaped, or are formed in steps. These components function together and are interconnected by electrical conductors, levers, rods and other drive elements, to perform the chosen appliance functions.

Many kinds of appliances are known, particularly in the area of entertainment electronics, which require a number of attachment elements for electrical and mechanical transmission elements and components. A good example is a video recorder chassis, which has a particularly high number of attachment elements, with attaching devices for carrying and affixing the predominantly mechanical components of the threading and tape drive installations, cassette insertion and ejection installations, and similar installations. However, such complicated and difficult to assemble chassis must be cost-effectively manufactured for entertainment electronics. For that reason, particularly low-cost manufacturing methods are sought, for example, in which immovable attachment elements are affixed to the chassis in one operation, if possible. If, for example, suitable injection molding materials are available for such a chassis, the chassis, including the affixed attachment elements, can be manufactured by injection molding as a single component. However, for reasons of mechanical and temperature-dependent dimensional stability, it is often necessary to manufacture a two- or more component chassis, whose body or essential parts are made of metal, to which the attachment elements, made of a suitable plastic material, are permanently affixed. For example, with the known 'outsert' technique, the metal plate of the chassis is used as one of the injection channel's peripheries. The attachment elements manufactured in one operation in this manner, are partially connected to each other by injection links above the metal plate of the chassis, and are permanently affixed to the metal plate by molding material injected through openings in the metal plate. The attachment elements are generally formed so that the components to be affixed to the chassis can be inserted or locked to the attachment elements by means of assembly devices, and the components can be locked or snapped into position in the attachment elements.

For simplified manufacturing purposes, no component units or groups are placed on the chassis. Rather, the individual parts of a component unit or group are directly held or supported on the chassis, so that the full assembly of the chassis can be cost-effectively performed in one operation. However, such a chassis has the disadvantage that, if one of the attachment elements is damaged by improper handling of the appliance, or during servicing, the damaged attachment element cannot be replaced, and, in the worst of cases, the entire chassis must be replaced. However, this represents a large expense for the repair of an appliance that is equipped with such a chassis, which often leads to annoyance at the service station and is thereby detrimental to the manufacturer.

SUMMARY OF THE INVENTION

The invention therefore has the task of significantly improving the service friendliness of a chassis described in the beginning, and to prevent that damage to the attachment elements, which are immovably connected to the chassis because of cost-effective chassis production, leads to the unserviceability of the entire chassis.

The advantage of the invention consists in that the professional is not only able to repair the item, but that additional means for repairing are made available.

In addition, it is especially advantageous that repair means, namely an additional repair element assigned to an immovable attachment element, can be separated at a predetermined break-off point in the immediate vicinity of the permanent attachment element, and can be rigidly connected to the chassis or the immovable attachment element, or to a holding part. In both instances, the repair elements can be manufactured with the same injection process that also produces the attachment elements on the appliance chassis. The manufacture of the repair elements therefore requires no additional operation.

BRIEF DESCRIPTION OF THE DRAWINGS

The invention will now be described in more detail by means of advantageous configuration examples.

In the pertinent drawings.

BEST MODE FOR CARRYING OUT THE INVENTION

Figures 1A, 1B, 1C:
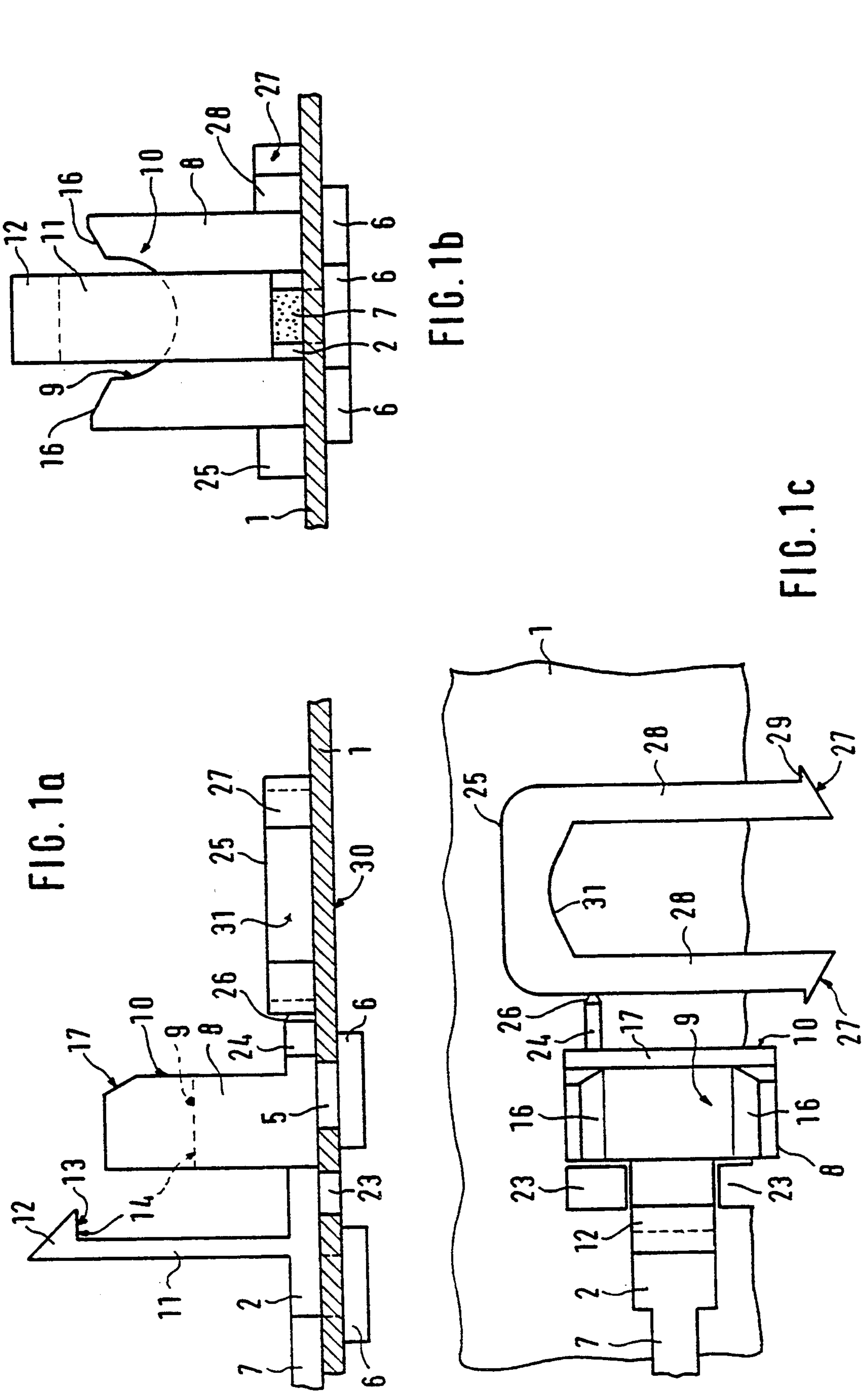
FIGS. 1*a*–1*c* are three different views of a section of an appliance chassis with an attachment element that is immovably affixed to the chassis, and a respective repair element injection molded thereto, FIGS. 2–4 one each section of an appliance chassis in FIG. 1*a*, with part of a component in the assembly stage (FIG. 2), the component holder and support (FIG. 3), and damage of part of the attachment element due to the unprofessional removal of the component.
Figure 2:
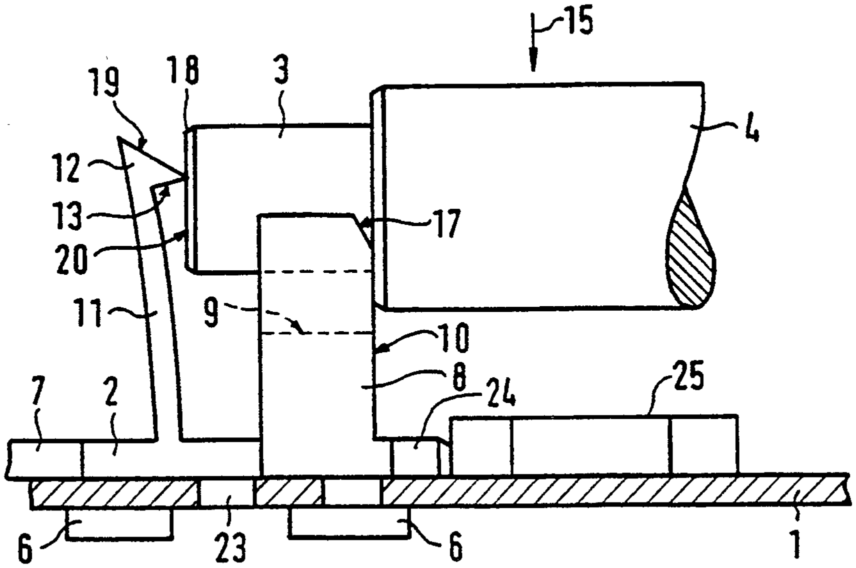
Figure 3:
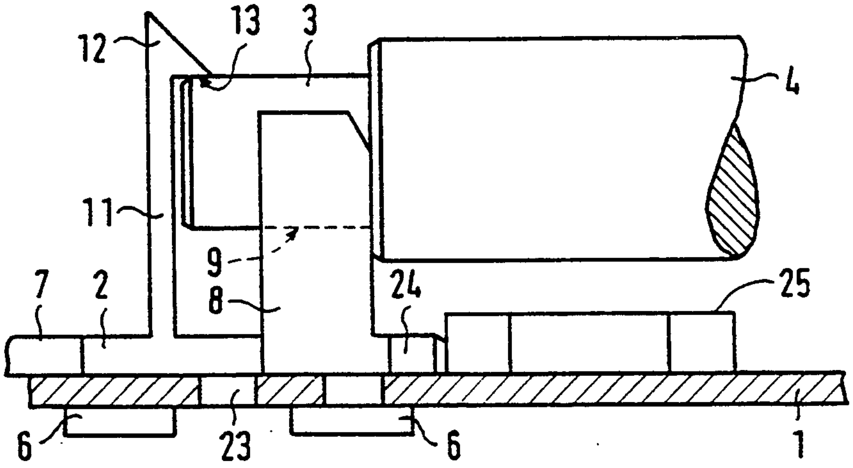
Figure 4:
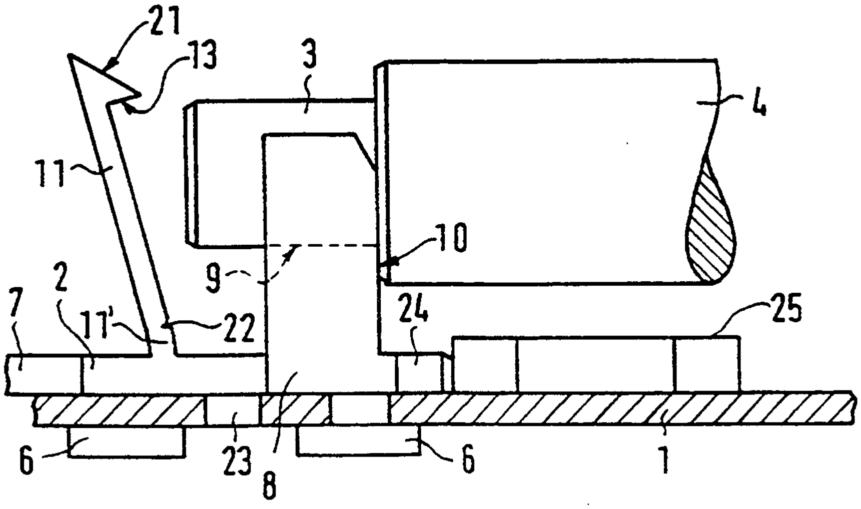

FIGS. 1*a* and 1*b* are two schematic side views, rotated 90° with respect to each other, of the section of an appliance chassis 1 shown in a top view in FIG. 1*c*, in the place of an attachment element for the bearing journal 3 of a mechanical or electrical component 4 represented in FIGS. 2–4. The attachment element 2 is placed on the chassis plate of appliance chassis 1 by means of a certain plastic injection molding technique, for example the so-called 'outsert' technique, and is permanently attached to the plate of appliance chassis 1 by attachment heads 6, which are injection molded through openings 5. The attachment elements placed on appliance chassis 1 in one operation, are connected to each other by injection molded links 7. The attachment element 2 shown as an example, contains a bearing block 8 for carrying and affixing component 4 held by it, with a half shell 9 for supporting the bearing journal 3 of component 4, and an external stop 10 for component 4. In addition, component 2 comprises a flexible arm 11 with a catch nose 12 at its end, whose catching surface 13 prevents the bearing journal 3, which is supported in the half shell 9 of bearing block 8, from falling off the half shell, as can be seen in FIG. 3. The half shell 9, the stop 10 and the catching surface 13 form the holding device 14 of attachment element 2, for supporting and affixing component 4 to its bearing journal 3.

FIGS. 2 to 5*b* describe in more detail the operation of the attachment element depicted in FIGS. 1*a* to 1*c* for a component 4. The illustration of the component 4, which is not shown and described in detail in the named figures, comprises only the part with the bearing journal 3. In FIG. 2, component 4 is being assembled on chassis 1 in the direction of arrow 15. During the assembly, the sliding surfaces 16 and 17 lead the component 4 into the correct position inside the attachment element 2. The forward edge 18 of the bearing journal 3 on component 4 now slides along the sliding surface 19 of flexible arm 11 of the attachment element, and then the forward edge 20 of bearing journal 3 slides on the catch nose 12 of the flexible arm until the bearing journal 3 on component 4 reaches the bottom of the half shell 9 and the now released bent catch arm 11 springs back and its catching surface overlaps bearing journal 3 (FIG. 3), so that the bearing journal 3 is radially supported on all sides by the attachment element. If the component 4 must be removed from its supported position in attachment element 2, for example during servicing, the catch arm 11 must be bent by applying sideways pressure in the direction of arrow 21, until the component 4 can be lifted from the half shell of bearing block 8 in the attachment element 2, as shown in FIG. 4.

Figure 5B:
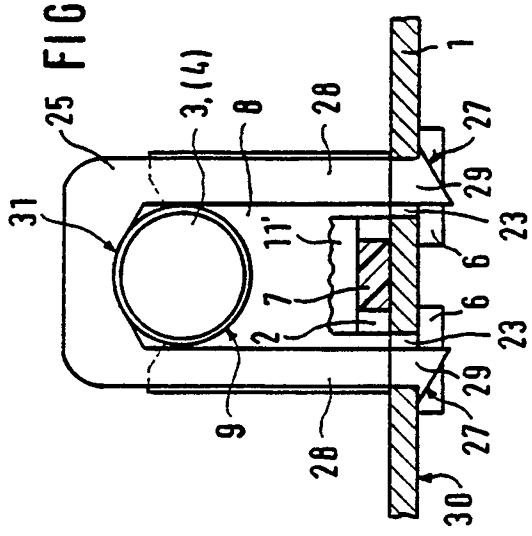
FIGS. 5*a*–5*b* is a section of an appliance chassis shown in figures 1*a* and 1*b*, with a damaged attachment element, a component inserted therein, and a replacement element inserted for the repair.
Figure 5A:
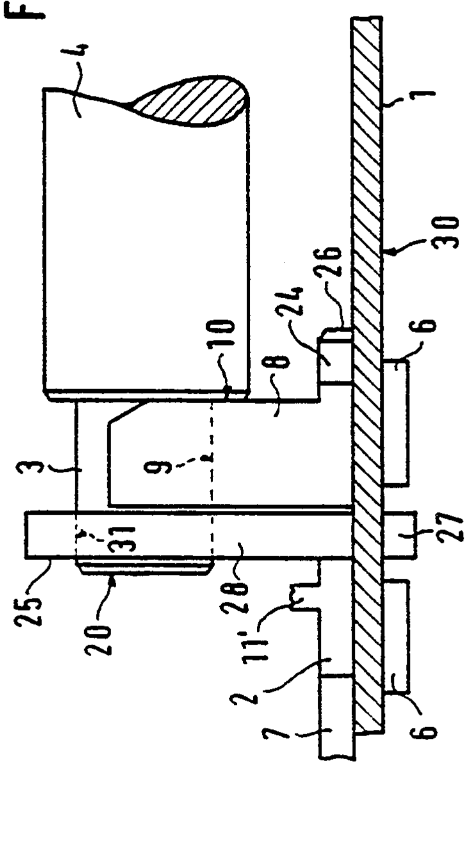

If the catch arm 11 of the attachment element 2 is bent too far by pressure 21 on its sliding surface 19, the danger exists that it breaks at break-off point 22, as equally depicted in FIG. 4. It should be noted that damaged or replacement elements shown in the figures use the same reference number as the original component with a prime (') added thereto, such as the damaged portion of catch arm 11 below break-off point 22 (shown by reference element 11'). In that way the damaged attachment element 2 loses an essential holding function and becomes useless. In the illustrated configuration example, let us assume that it is not possible to remove the damaged and now useless attachment element from appliance chassis 1, because of the number of components located on the appliance chassis and the density of the assembly, and to replace it with a new, undamaged attachment element of the same type. In that instance, the entire appliance chassis must be replaced in the appliance containing it, which, in addition to the elevated costs, also causes a high degree of uneasiness to the appliance owner. For that reason, the configuration example of an appliance chassis depicted in FIGS. 1*a* to 5*b*, contains two openings 23 in the base plate of chassis 1, adjacent to the bearing block 8 of the shown attachment element 2, as an attaching device for a U-shaped repair element 25, which is injection molded to the attachment element by means of a link 24. This repair element breaks off from the link 24 to attachment element 2 at break-off point 26, and is pushed over the bearing journal 3 of component 4 into the openings 23 by means of its slide surfaces 27 at the end of both legs 28, until the catch hooks 29 at the end of legs 28 of repair element 25 catch behind the underside 30 of the base plate of appliance chassis 1, as shown in FIGS. 5*a* and 5*b*. The inside 31 of the connection piece on both legs 28 of the U-shaped repair element 25 replaces the catch surface 13 of catch arm 11 of attachment element 2, which is now rendered useless because of damage, and instead of the catch surface 13, forms part of the holding device 14 of attachment element 2, whose other installed parts are the undamaged bearing half shell 9 and the undamaged stop 10 of attachment element 2.

Figure 6D:
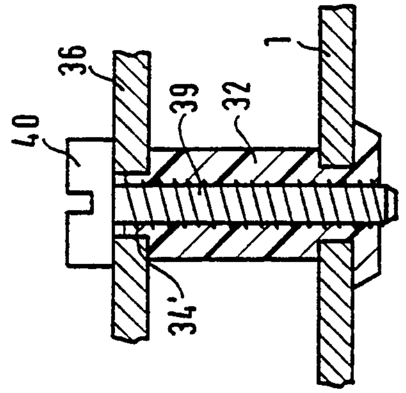
FIGS. 6*a*–6*d* is a side view of a section of an appliance chassis with a column-shaped attachment element for attaching a plate-shaped component in the rough condition prior to attachment of the component (FIG. 6*a*), in the component's attached condition (FIG. 6*b*), in the damaged condition (FIG. 6*c*), and in the repaired condition (FIG. 6*d*) of the component's attachment.
Figure 6C:
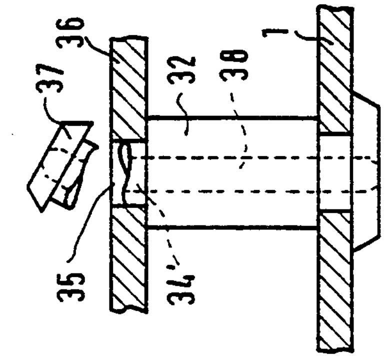
Figure 6B:
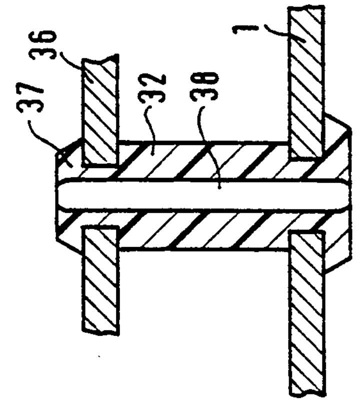
Figure 6A:
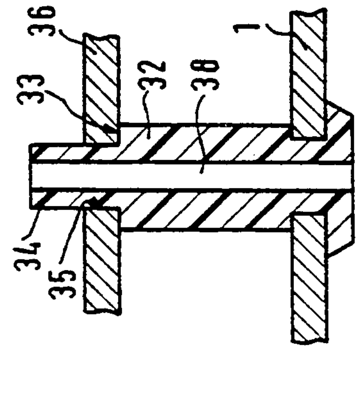

FIGS. 6*a* to 6*d* illustrate a section of appliance chassis 1 with a column-shaped attachment element 32, which consists of a material that can be hot-molded, and is permanently affixed to the chassis plate. At the head, the attachment element 32 contains an annular support face 33 around a central hollow mandrel 34, which protrudes through a bore 35 in a subchassis 36, and rests on the annular support face of the column-shaped attachment element 32, as shown in FIG. 6*a*. After the subchassis 36 is installed on the column-shaped attachment element 32, the hollow mandrel is hot-molded into a retaining head 37, which overlaps the bore 35 in subchassis 36 and secures the column-shaped attachment element 32, as shown in FIG. 6*b*. If this retaining head 37 must be removed during servicing, or if it breaks off for any reason as schematically indicated in FIG. 6*c*, the column-shaped attachment element 32 can still be used as an attachment element, because it contains a central bore 38 as an attaching device for a self-tapping screw 39. The head 40 of the self-tapping screw 39, which is screwed into the central bore 38 of the column-shaped attachment element 32 as a repair element, affixes the subchassis 36 in the same manner as the original retaining head 37 of the column-shaped attachment element 32, as shown in FIG. 6*d*.

Figure 8:
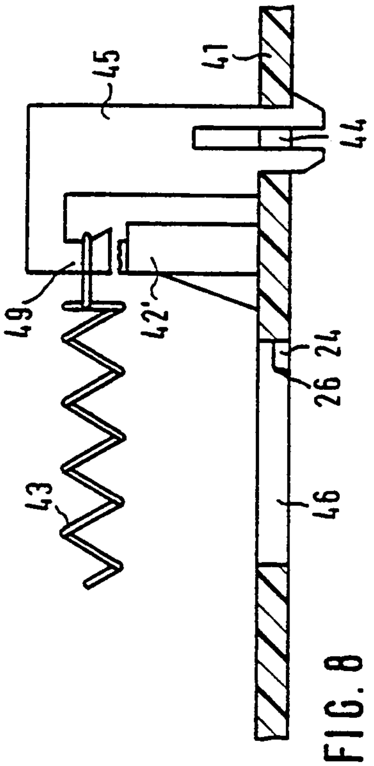
FIG. 8 is the appliance chassis section in FIG. 7*b* with a damaged attachment element and an inserted repair element to replace the attachment element.
Figure 7A:
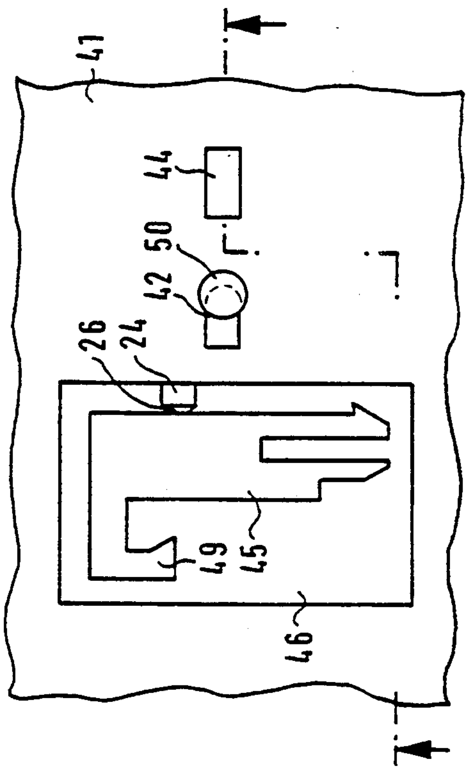
FIGS. 7*a*–7*b* are a top view and a side view of a section of a single component appliance chassis with an attachment element for a tension spring that is injection molded as a single piece to the appliance chassis, and with a repair element injection molded as a single piece.
Figure 7B:
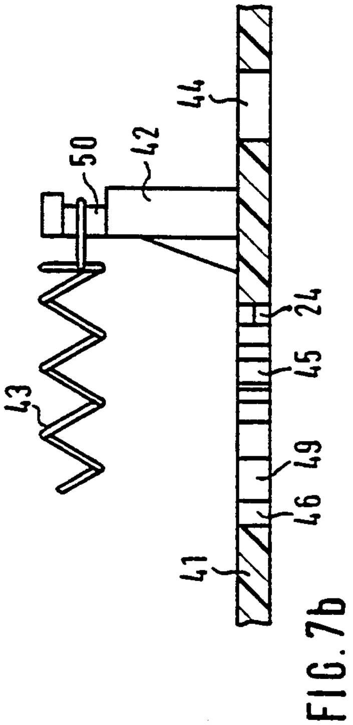

FIGS. 7*a* and 7*b* show a top view and a side view of a section of an injection molded plastic appliance chassis 41. A column-shaped attachment element 42, for supporting and affixing a tension spring 43, is injection molded to this section of the appliance chassis 41. The appliance chassis 41 contains an attachment opening 44 immediately behind the column-shaped attachment element, for affixing a hook-shaped repair element 45, which forms a single piece with appliance chassis 41 by means of a link 47 in a cutout 46. If the column-shaped attachment element 42 breaks partially or totally, due to improper handling of the appliance chassis 41 as schematically shown in FIG. 8, the hook-shaped repair element 45 is broken out of the cutout 46 in the appliance chassis 41 at the break-off point 48, and is hooked through the attachment opening 44. In this condition of the repair element 45, the attachment hook 49 for tension spring 43 is in the same place as previously the retaining head 50 of the undamaged column-shaped attachment element 42, as shown in FIG. 8.

Figure 9:
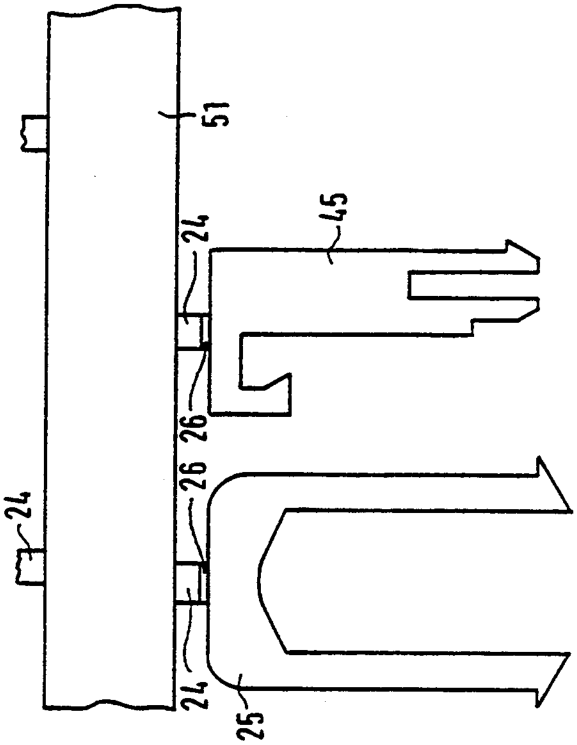
FIG. 9 is a section of a repair element tree with breakaway repair elements.

The above cited configuration examples of attachment elements 2, 32 or 42, which are permanently affixed to the appliance chassis, whose holding device 14 for supporting and affixing certain components can be restored with the designated repair elements 25, 39 or 45 if the attachment elements have been damaged, represent examples of different possibilities for making the repair elements available. Another possibility of the availability of such repair elements is shown by the configuration example in FIG. 9. Different repair elements 25, 45 are injection molded with links 24 to a supply strip 51, and can be broken off from the links 24 at break-off points 26, when needed, and inserted into the respective attaching devices for the repair elements on the appliance chassis and/or into the respective attachment element. This supply strip with the injection molded repair elements can be produced during the same operation, in which attachment elements 2 are affixed to appliance chassis 1, or when a single piece appliance chassis is manufactured.

Figure 10A:
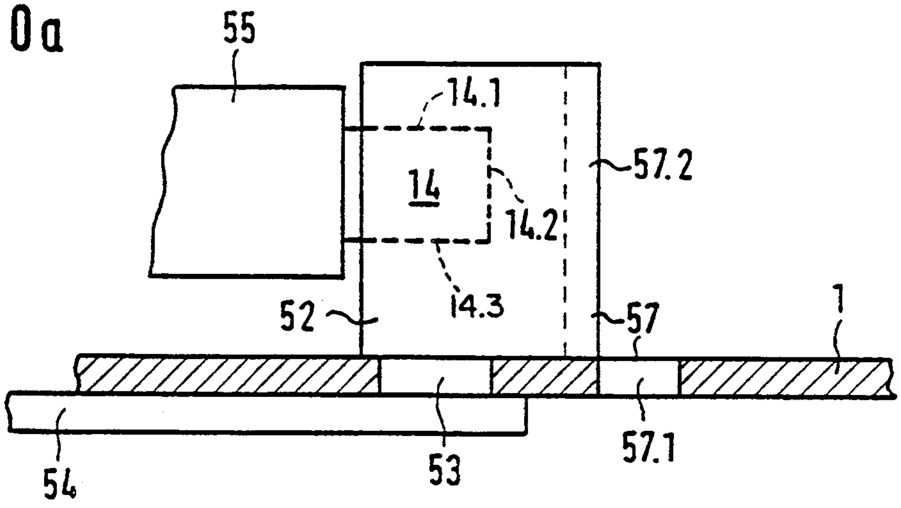
FIGS. 10*a*–10*c* are the side view of a section of an appliance chassis with a generically represented attachment element and inserted component in normal operation (FIG. 10*a*), in the damaged condition of the attachment element (FIG. 10*b*) and in the repaired condition (FIG. 10*c*).

FIG. 10*a* again is a side view of a section of an appliance chassis with an attachment element 52 illustrated schematically. The attachment element 52 is permanently affixed to appliance chassis 1 by an injection molded lug 53 and an injection molded plastic link 54, and is configured so that the component 55, which is to be supported and affixed in a holding device therein, can be inserted into the holding device 14 for the component during an automatic assembly procedure. The holding device of attachment element 55 is schematically illustrated in FIG. 10*a* by the bold broken line 14.1, 14.2 14.3 representing parts thereof.

Figure 10B:
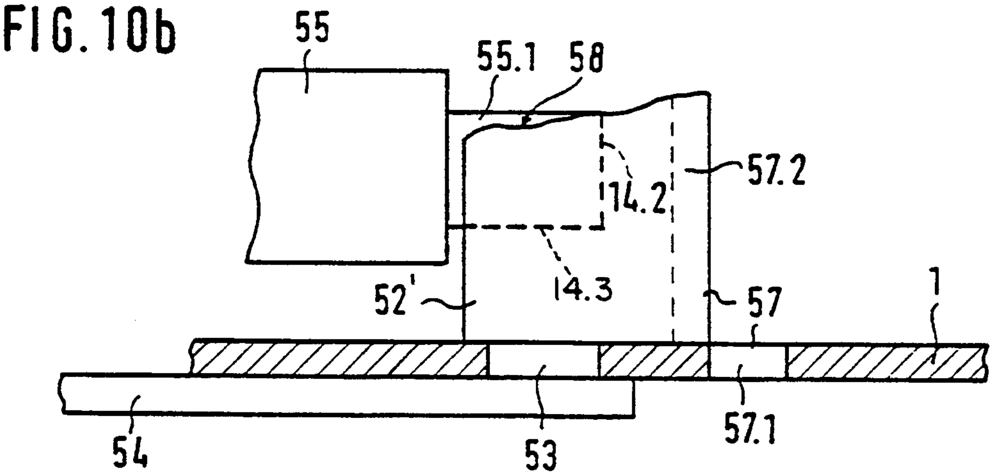
Figure 10C:
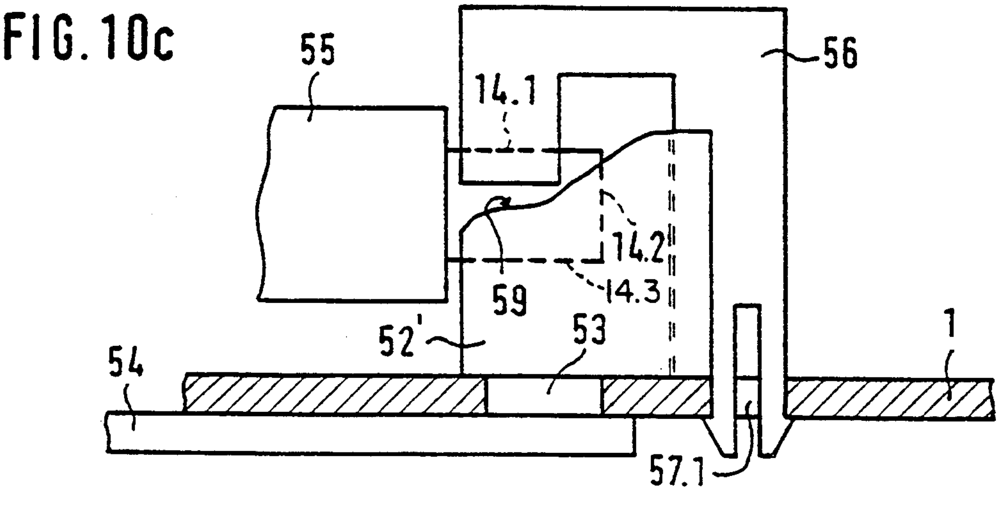

FIG. 10*b* is the same illustration as FIG. 10*a*, but with an attachment element 52′ damaged by an effect not described in detail here. As a result of the damage to attachment element 52, the holding device 14 is no longer whole, so that component 55 can no longer be affixed and supported by the damaged attachment element 52 as specified. A repair element 56 is provided for that reason, which replaces the parts 14.1 lost because of the possible damage to attachment element 52. To affix a repair element 56 designated for the damaged attachment element, an additional opening 57.1 is schematically illustrated immediately behind the attachment element in chassis 1, with an attachment groove 57.2 in the attachment element 52 adjacent to the opening forming an attaching device 57 for the respective damaged attachment element 52′. The repair element 56 inserted into attaching device 57, includes a part 14.1′ of holding device 14 of attachment element 52, as clearly shown in FIG. 10*c*. Prior to inserting the repair element 56, the break-off edge 58 (FIG. 10*b*) of the damaged attachment element must be cut off (cut-off edge 59, FIG. 10*c*), so that sufficient space is created to insert the repair element into its attaching device.

We claim:

1. An appliance chassis (1) with immovably affixed attachment elements (52), with at least one holding device (14), having parts thereof for supporting components (55) to the chassis, to which the respective attachment element containing the holding device is assigned, characterized in that an attaching device (57) for a predetermined attachment element (52) is formed directly on the attachment element (52) for holding a repair element (56) for connection to the attachment element, and that after said predetermined attachment element (52) is damaged (58), the repair element (56) can be inserted into the corresponding attaching device (57), wherein said repair element (56) contains means, in conjunction with certain not damaged parts of the holding device, for supporting components to the chassis.

2. An appliance chassis (1) with immovably affixed attachment elements (52), with at least one holding device (14), having parts thereof (14.1, 14.2, 14.3) for supporting, holding and affixing components (55) to the chassis to which the respective attachment element containing the holding device is assigned, characterized in that an attaching device (57) for a predetermined attachment element (52) is formed directly on the chassis (1) and the attachment (52) for immovably holding and affixing a repair element (56) for connection to the attachment element, and that after said predetermined attachment element (52) is damaged (58), the repair element (56) can be inserted into the corresponding attaching device (57), wherein said repair element (56) contains a second holding device part (14.1′), that, in conjunction with certain not damaged parts (14.2, 14.3) of the holding device (14) of the damaged attachment element (52′), becomes a replacement that is similar to the holding device (14) of the previous undamaged attachment element (52).

3. An appliance chassis with immovably affixed attachment elements as in claim 2, characterized in that a repair element (25, 45) is connected to the chassis at at least one predetermined break-off point (26) so that the repair element can be separated from the chassis at said at least one break-off point.

4. An appliance chassis with immovably affixed attachment elements as in claim 2, characterized by a supply strip (51) to which at least one repair element (25, 45) is attached at at least one predetermined break-off point (26) so that the repair element can be separated from the supply strip at said at least one break-off point.

5. An appliance chassis with immovably affixed attachment elements as in claim 2, characterized in that a repair element is permanently attached to the attachment element.

* * * * *